United States Patent
Cheong

(10) Patent No.: US 9,515,634 B1
(45) Date of Patent: Dec. 6, 2016

(54) SELECTING OF A PRE-FILTER IN A RECEIVER OF A COMMUNICATION SYSTEM

(71) Applicant: Marvell International Ltd., Hamilton (BM)

(72) Inventor: Kok-Wui Cheong, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/044,690

(22) Filed: Feb. 16, 2016

Related U.S. Application Data

(60) Provisional application No. 62/117,215, filed on Feb. 17, 2015.

(51) Int. Cl.
| | |
|---|---|
| *H03H 17/02* | (2006.01) |
| *H04B 1/10* | (2006.01) |
| *H03H 21/00* | (2006.01) |

(52) U.S. Cl.
CPC ............ *H03H 17/0248* (2013.01); *H04B 1/10* (2013.01); *H03H 21/0001* (2013.01)

(58) Field of Classification Search
CPC .... H03H 17/0248; H03H 21/0001; H04B 1/10
See application file for complete search history.

(56) References Cited

U.S. PATENT DOCUMENTS

| | | | | |
|---|---|---|---|---|
| 3,649,916 A | * | 3/1972 | Winters | H04L 25/03006 327/100 |
| 4,450,531 A | * | 5/1984 | Kenyon | G06F 17/15 708/5 |
| 5,355,530 A | * | 10/1994 | Ikeda | H04B 1/10 455/212 |
| 7,932,844 B1 | * | 4/2011 | Huynh | H03H 11/1291 341/120 |
| 9,319,057 B1 | * | 4/2016 | Pandey | H03M 1/0626 |
| 2007/0299655 A1 | * | 12/2007 | Laaksonen | G10L 21/038 704/205 |
| 2013/0083876 A1 | * | 4/2013 | Suzuki | H04B 1/1036 375/350 |

* cited by examiner

*Primary Examiner* — Jean B Corrielus

(57) ABSTRACT

Embodiments provide a receiver comprising an input coupled to a communication channel for receiving an input signal from the communication channel, a first processing filter coupled to the input, and a first level estimation module coupled to the first processing filter to estimate a first level of the input signal based upon the first processing filter. The receiver further comprises a second processing filter coupled to the input, a second level estimation module coupled to the second processing filter to estimate a second level of the input signal based upon the second processing filter, and a control module coupled to (i) the first level estimation module and (ii) the second level estimation module, wherein the control module includes logic configured to select an analog pre-filter for the input signal based upon (i) the first level of the input signal and (ii) the second level of the input sign.

20 Claims, 4 Drawing Sheets

SELECTING OF A PRE-FILTER IN A RECEIVER OF A COMMUNICATION SYSTEM

CROSS REFERENCE TO RELATED APPLICATIONS

This claims priority to U.S. Provisional Patent Application No. 62/117,215, filed Feb. 17, 2015, the entire specification of which is hereby incorporated by reference in its entirety.

TECHNICAL FIELD

Embodiments of the present disclosure relate to an analog pre-filter in a receiver in a communication system, and more particularly to processing of input signals for the analog pre-filter in order to select and/or modify the analog pre-filter.

BACKGROUND

Communication systems in high speed systems such as, for example, Ethernet systems, generally include a transmitter that provides signals to a receiver over a communication channel. Often, the communication channel is a low pass channel such as, for example, a copper wire, a copper trace on a printed circuit board, an optical fiber, etc. Generally, since the communication channel is usually a low pass channel, high frequencies of the signals are attenuated over the communication channel. Accordingly, the receiver generally includes a pre-filter, and more particularly, an analog pre-filter, in order to boost high frequency portions of received signals. The analog pre-filter can also provide a direct current (DC) gain if desired. Such communication systems are generally in accordance with 10 gigabit Ethernet standards for transmitting Ethernet frames at a rate of 10 gigabits per second. Examples of such standards established by IEEE 802.3-2008 include, but are not limited to, 10GBASE-KX4, 10GBASE-KR and 10GBASE-T. Such standards generally relate to implementing different 10 Gb physical layer standards that utilize forms of copper as the communication channel. Other standards for interfaces have been developed, such as, for example, XAUI, XFI and 10GBASE-LRM that utilize optical modules and thereby use optical fiber as the communication channel.

With such communication systems, there may be difficulty in selecting an appropriate analog pre-filter. For example, problems can occur when selecting the analog pre-filter according to the amplitude or energy of received signals. In cases where the communication channel consists of a copper wire or traces, channel attenuation is correlated to the length of the wire or trace. However, the degree of frequency dependent loss within the communication channel varies in different cases, i.e., the performance of the communication channel may vary. For example, the analog pre-filter may not function as designed, or the operating parameters, e.g., temperature, may affect the performance of the communication channel. In cases where the communication channel consists of an optical fiber, certain optical to electrical module connections amplify the received signals to a predetermined level for output. In such a case, the signal level of the received signal cannot be used to indicate communication channel quality. In some instances, the analog pre-filter may be selected by "trials." In other words, the communication system may try various available analog pre-filters and determine if a receiver metric such as, for example, signal to noise ratio (SNR) or bit error rate (BER) meets the desired parameters. However, such trials generally take a long time and increase start-up time for the communication system. Additionally, several choices may work and thus, determining the best analog pre-filter requires an exhaustive search. Also, such trials require decoding of the received signals.

SUMMARY

In various embodiments, the present disclosure provides a receiver comprising an input coupled to a communication channel for receiving an input signal from the communication channel, a first processing filter coupled to the input, and a first level estimation module coupled to the first processing filter to estimate a first level of the input signal based upon the first processing filter. The receiver further comprises a second processing filter coupled to the input, a second level estimation module coupled to the second processing filter to estimate a second level of the input signal based upon the second processing filter, and a control module coupled to (i) the first level estimation module and (ii) the second level estimation module, wherein the control module includes logic configured to select an analog pre-filter for the input signal based upon (i) the first level of the input signal and (ii) the second level of the input signal.

In various embodiments, the present disclosure also provides a communication system comprising a transmitter coupled to a receiver with a communication channel, wherein the receiver comprises an input coupled to the communication channel for receiving an input signal from the communication channel, a first processing filter coupled to the input, and a first level estimation module coupled to the first processing filter to estimate a first level of the input signal based upon the first processing filter. The receiver further comprises a second processing filter coupled to the input, a second level estimation module coupled to the second processing filter to estimate a second level of the input signal based upon the second processing filter, and a control module coupled to (i) the first level estimation module and (ii) the second level estimation module, wherein the control module includes logic configured to select an analog pre-filter for the input signal based upon (i) the first level of the input signal and (ii) the second level of the input signal.

In various embodiments, the present disclosure also provides a method of selecting an analog pre-filter within a receiver, wherein the method comprises receiving an input signal from a communication channel, first processing the input signal with a first processing filter, and based upon the first processing of the input signal, estimating a first level of the input signal with a first level estimation module. The method further comprises second processing the input signal with a second processing filter, and based upon the second processing of the input signal, estimating a second level of the input signal with a second level estimation module. The method further comprises based upon (i) the first level of the input signal and (ii) the second level of the input signal, selecting an analog pre-filter for the input signal.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Figure 1:
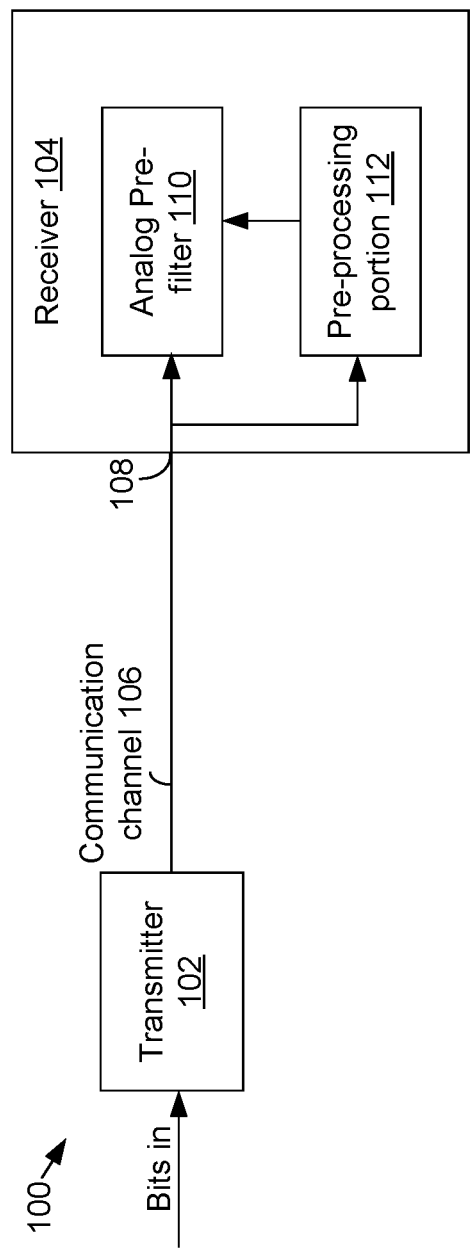
FIG. 1 schematically illustrates a communication system, in accordance with various embodiments.

Referring to FIG. 1, in accordance with various embodiments, a communication system 100, for example, a high speed communication system, such as, for example, an Ethernet system, includes a transmitter 102 and a receiver 104. Bits are supplied to the transmitter 102, which transmits the bits over a communication channel 106 to the receiver 104. The receiver 104 generally receives the bits as input signals at an input 108 and provides the input signals to an analog pre-filter 110 that generally boosts the input signals to a desired level. Although pre-filter 110 is generally an analog pre-filter, other types of filters may be used. In order to select the appropriate analog pre-filter 110, i.e., appropriate pre-filter configuration, the receiver 104 further includes a pre-processing portion 112 that pre-processes the received input signals to determine a measure of characteristics of the communication channel 106.

Figure 2:
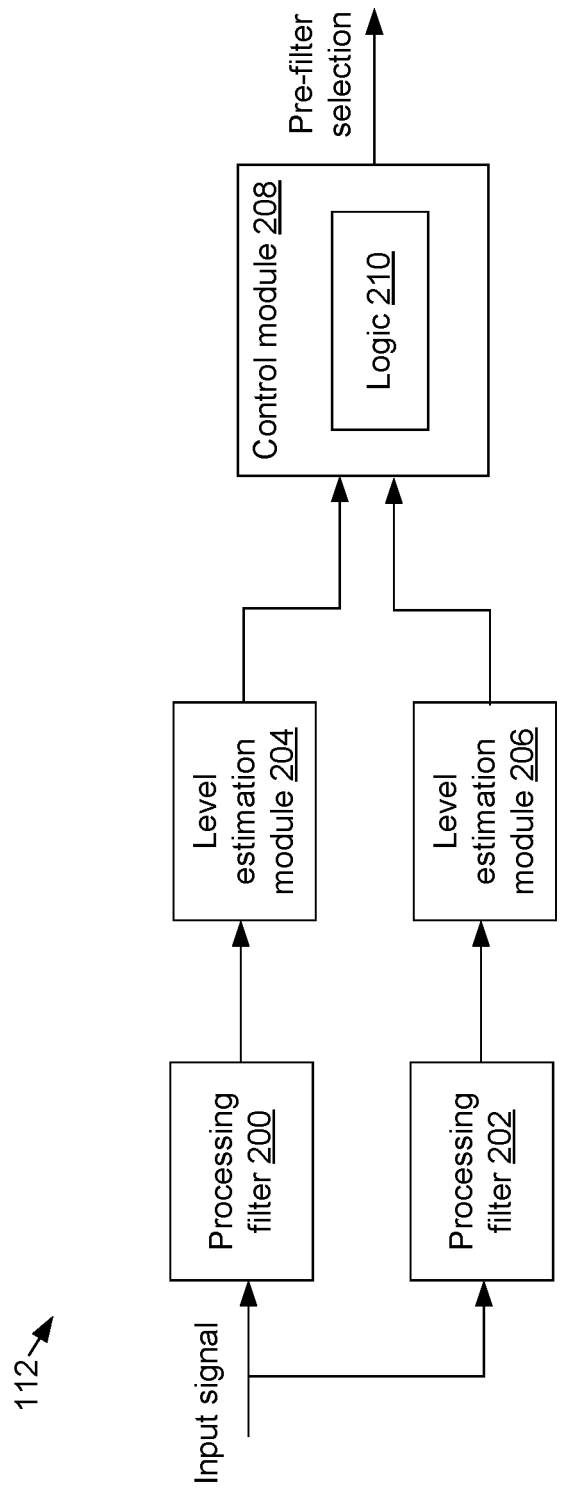
FIG. 2 schematically illustrates a pre-processing portion for selecting an analog pre-filter within a receiver of the communication system illustrated in FIG. 1, in accordance with various embodiments.

Referring to FIG. 2, the pre-processing portion 112 includes a first processing filter 200 and a second processing filter 202. The pre-processing portion 112 further includes a first level estimation module 204 and a second level estimation module 206. Finally, the pre-processing portion 112 includes a control module 208 that includes logic 210 for selecting the analog pre-filter 110. In general, the pre-processing portion 112 is included in the physical (PHY) layer of an Ethernet communication module that includes the receiver 104. Indeed, generally, the entire receiver 104 is within the PHY layer.

In accordance with various embodiments, the first processing filter 200 is an all pass filter. The second processing filter 202 may be one of various types of filters such as, for example, a low pass filter, a high pass filter or a narrow band filter, although other types of filters may be used if desired. In other embodiments, the second processing filter 202 is an all pass filter and the first processing filter 200 may be one of various types of filters such as, for example, a low pass filter, a high pass filter or a narrow band filter, although other types of filters may be used if desired. The level estimation modules 204, 206 estimate how much of a signal to provide to the control module 208 based upon the output of the processing filters 200, 202. Some methods for estimating such levels include, but are not limited to, a power or energy level estimation and peak or peak-to-peak signal level estimation. Generally, the estimation is to determine how strong of a signal to provide to the control module 208.

The control module 208 receives the signals from the level estimation modules 204, 206 and compares the signals received from the level estimation modules 204, 206 in order to decide on an appropriate analog pre-filter 110 for the receiver 104. For example, in accordance with embodiments, the first processing filter 200 is an all-pass filter and the first level estimation module 204 provides an estimated reference signal level. In such an embodiment, the second level estimation module 206 provides an estimated desired pre-processing signal level. For example, if the second processing filter 202 is a low pass filter, the second processing filter 202 and the second level estimation module 206 estimates the amount of signal in the lower frequency band of the input signal. The control module 208 compares the desired pre-processing signal level output from the second level estimation module 206 with the reference signal level provided by the first level estimation module 204. A relatively high level compared to the reference signal indicates a relatively severe low pass communication channel 106 and a higher boost analog pre-filter and appropriate DC gain level is desired for the analog pre-filter 110. As another example, if the second processing filter 202 is a high pass filter, the second processing filter 202 and the second level estimation module 206 estimates the amount of signal in the higher frequency band of the input signal. During comparison of the two signals by the control module, a relatively high level in the signal provided by the second level estimation module 206 compared to the reference signal indicates a relatively mild low pass communication channel 106 and a lower boost analog pre-filter and appropriate DC gain level estimated from the reference signal is desired for the analog pre-filter 110.

Thus, by pre-processing input signals at the receiver 104, trials in order to determine an appropriate analog pre-filter 110 can be eliminated. Furthermore, unlike the trials performed in accordance with the prior art, the input signals do not need to be decoded for analysis by the pre-processing portion 110. The input signals simply pass through the pre-processing portion 110 of the receiver 104 to the analog pre-filter 110. Additionally, the processing and level estimation generally takes less time than repeated trials, which provides for a faster start-up time for the communication system 100. The deterministic processing time helps contain start-up time "jitter," e.g., may lead up to full communication occurring more quickly when the entire communication link is up and running. Additionally, the pre-processing portion 112 may continue to be used in a tracking mode during operation of the communication system 100 and can be used to adapt to changes in the communication channel 100, i.e., the selection of the analog pre-filter 110 can be modified.

Figure 3:
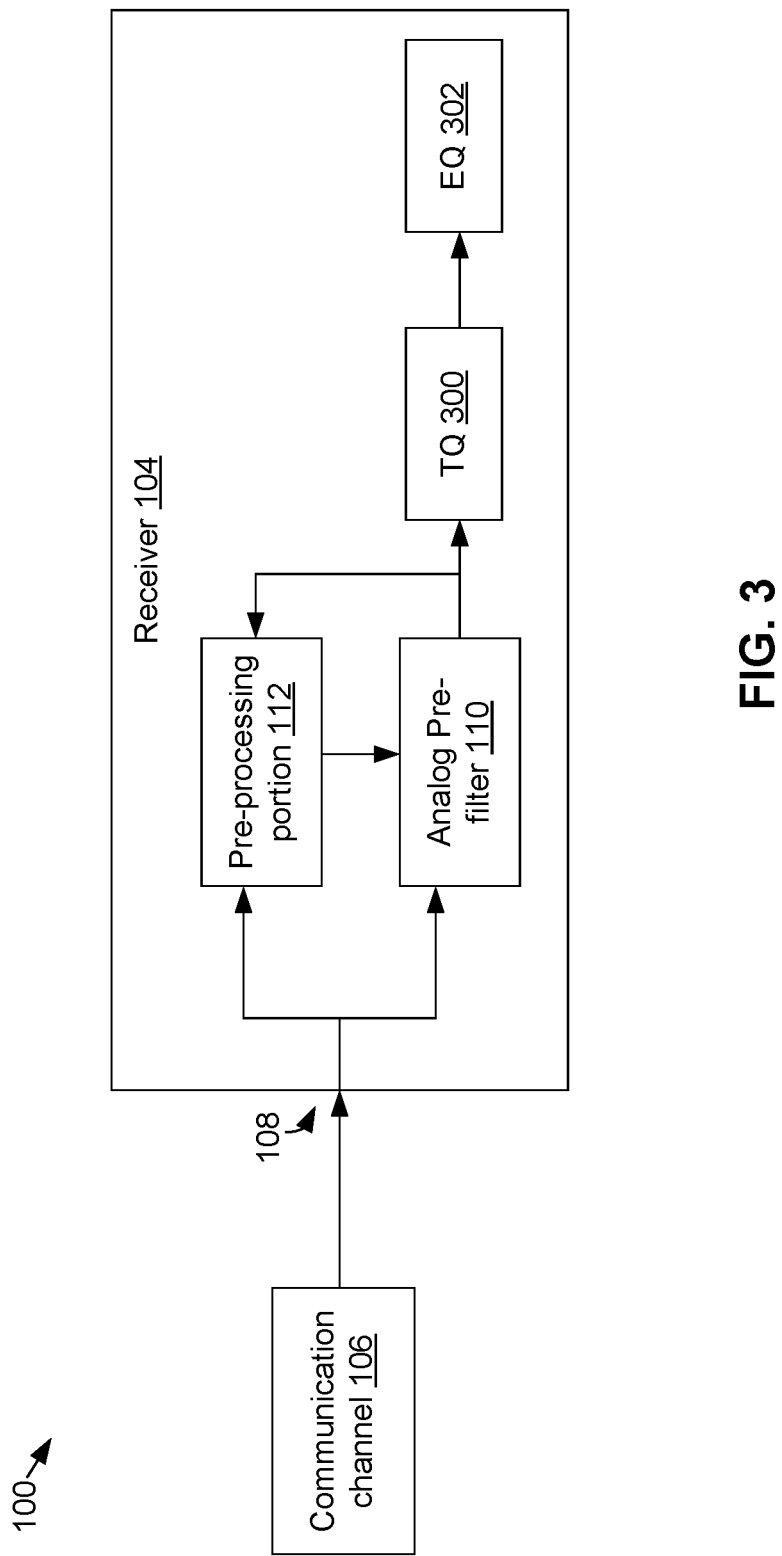
FIG. 3 schematically illustrates the receiver of the communication system illustrated in FIG. 1, in accordance with various embodiments.

For example, referring to FIG. 3, it can be seen that the pre-processing portion 112 can provide input to the analog pre-filter 110 based upon input from the analog pre-filter 110. As can be seen, input signals can be provided from the communication channel 106 to the pre-processing portion 112, which can select an analog pre-filter 110 as previously described. Based upon output from the analog pre-filter 110 provided to the pre-processing portion 112, the control module 108 of the pre-processing portion 112 can modify the analog pre-filter 110 and/or select a new analog pre-filter 110. Additionally, as can be seen, in embodiments the analog pre-filter 110 provides the input signals to a timing recovery portion 300 of the receiver 104, which in turn provides the signals to an equalizer 302. Generally, the equalizer 302 can make adjustments based upon changes in the operating parameters or conditions of the receiver 104. However, it may be more desirable to have the pre-processing portion 112 make adjustments to the analog pre-filter 110 as opposed to the equalizer 302 making adjustments to the signals.

Figure 4:
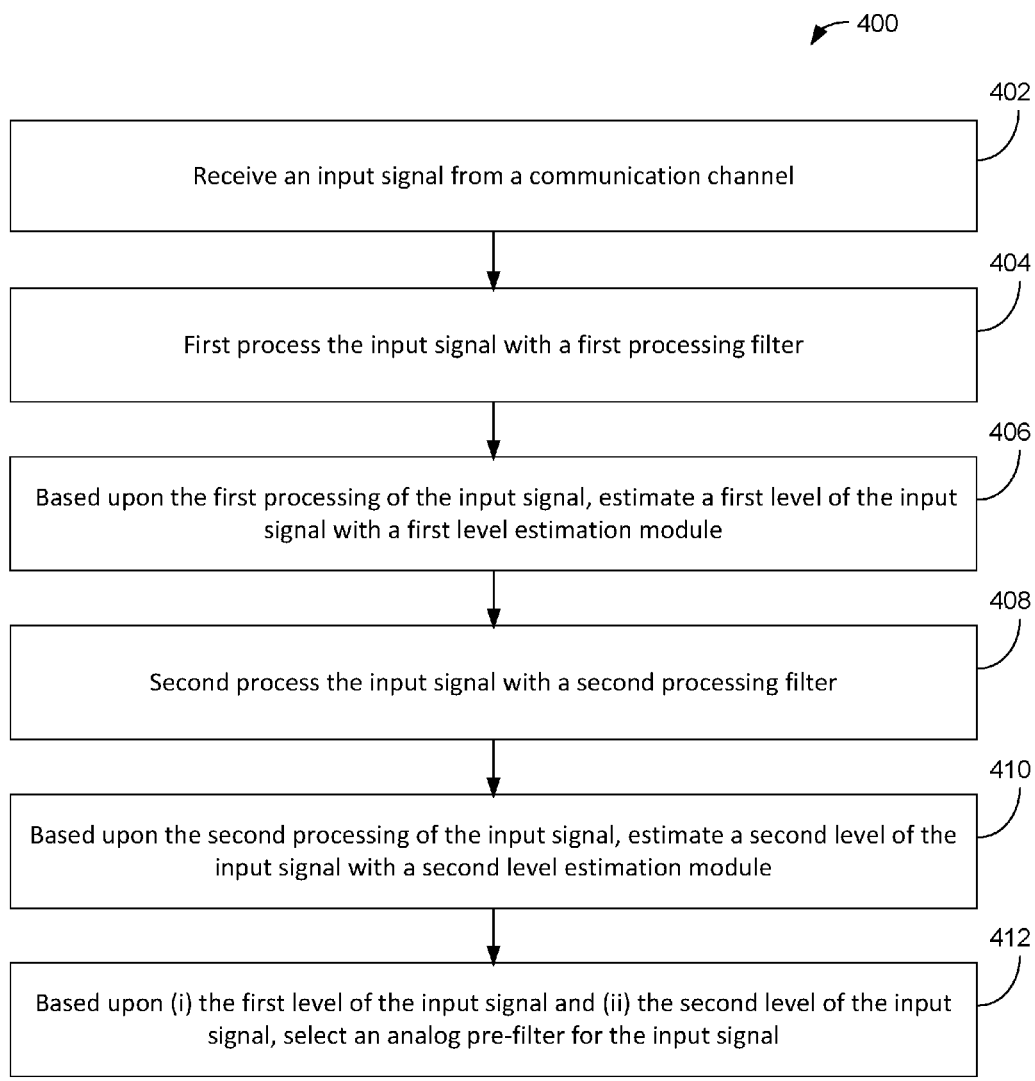
FIG. 4 is a flow diagram of an example method for selecting an analog pre-filter within a receiver, in accordance with various embodiments.

FIG. 4 is a flow diagram of an example method 400 for selecting an analog pre-filter within a receiver. At 402, an input signal is received from a communication channel. At 404, the input signal is first processed with a first processing filter. At 406, based upon the first processing of the input signal, a first level of the input signal is estimated with a first level estimation module. At 408, the input signal is second processed with a second processing filter. At 410, based upon the second processing of the input signal, a second level of the input signal is estimated with a second level estimation module. At 412, based upon (i) the first level of the input signal and (ii) the second level of the input signal, an analog pre-filter for the input signal is selected.

The description may use perspective-based descriptions such as up/down, over/under, and/or, or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order-dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A receiver comprising:
an input coupled to a communication channel for receiving an input signal from the communication channel;
a first processing filter coupled to the input;
a first level estimation module coupled to the first processing filter to estimate a first level of the input signal based upon the first processing filter;
a second processing filter coupled to the input;
a second level estimation module coupled to the second processing filter to estimate a second level of the input signal based upon the second processing filter; and
a control module coupled to (i) the first level estimation module and (ii) the second level estimation module, wherein the control module includes logic configured to select an analog pre-filter for the input signal based upon (i) the first level of the input signal and (ii) the second level of the input signal.

2. The receiver of claim 1, wherein:
the first level of the input signal is a reference;
the logic selects the analog pre-filter based upon a comparison of the first level of the input signal with the second level of the input signal.

3. The receiver of claim 2, wherein:
the first processing filter is an all pass filter; and
the second processing filter is one of (i) a low pass filter, (ii) a high pass filter or (iii) a narrow band pass filter.

4. The receiver of claim 1, wherein the communication channel comprises one of (i) copper wire, (ii) copper trace or (iii) optical fiber.

5. The receiver of claim 1, wherein the receiver is included within an ethernet physical (PHY) layer coupled to the communication channel.

6. The receiver of claim 1, wherein the logic is further configured to modify the analog pre-filter based upon information from the analog pre-filter.

7. The receiver of claim 6, wherein the information comprises one or more of (i) one or more parameters related to a manufacturing process for the receiver or (ii) one or more parameters related to operating the receiver.

8. The receiver of claim 7, wherein the one or more parameters related to operating the receiver comprise temperature.

9. A communication system comprising a transmitter coupled to a receiver with a communication channel, wherein the receiver comprises:
an input coupled to the communication channel for receiving an input signal from the communication channel;
a first processing filter coupled to the input;
a first level estimation module coupled to the first processing filter to estimate a first level of the input signal based upon the first processing filter;
a second processing filter coupled to the input;
a second level estimation module coupled to the second processing filter to estimate a second level of the input signal based upon the second processing filter; and
a control module coupled to (i) the first level estimation module and (ii) the second level estimation module, wherein the control module includes logic configured to select an analog pre-filter for the input signal based upon (i) the first level of the input signal and (ii) the second level of the input signal.

10. The communication system of claim 9, wherein:
the first level of the input signal is a reference;
the logic selects the analog pre-filter based upon a comparison of the first level of the input signal with the second level of the input signal.

11. The communication system of claim 10, wherein:
the first processing filter is an all pass filter; and
the second processing filter is one of (i) a low pass filter, (ii) a high pass filter or (iii) a narrow band pass filter.

12. The communication system of claim 9, wherein the communication channel comprises one of (i) copper wire, (ii) copper trace or (iii) optical fiber.

13. The communication system of claim 9, wherein the receiver is included within an ethernet physical (PHY) layer coupled to the communication channel.

14. The communication system of claim 9, wherein the logic is further configured to modify the analog pre-filter based upon information from the analog pre-filter.

15. The communication system of claim 14, wherein the information comprises one or more of (i) one or more parameters related to a manufacturing process for the receiver or (ii) one or more parameters related to operating the receiver.

16. The communication system of claim 15, wherein the one or more parameters related to operating the receiver comprise temperature.

17. A method of selecting an analog pre-filter within a receiver, the method comprising:
   receiving an input signal from a communication channel;
   first processing the input signal with a first processing filter;
   based upon the first processing of the input signal, estimating a first level of the input signal with a first level estimation module;
   second processing the input signal with a second processing filter;
   based upon the second processing of the input signal, estimating a second level of the input signal with a second level estimation module; and
   based upon (i) the first level of the input signal and (ii) the second level of the input signal, selecting the analog pre-filter for the input signal.

18. The method of claim 17, wherein:
   the first level of the input signal is a reference;
   selecting the analog pre-filter for the input signal comprises comparing the first level of the input signal with the second level of the input signal.

19. The method of claim 17, further comprising:
   modifying the analog pre-filter based upon information from the analog pre-filter.

20. The method of claim 19, wherein the information comprises one or more of (i) one or more parameters related to a manufacturing process for the receiver or (ii) one or more parameters related to operating the receiver.

\* \* \* \* \*